(12) United States Patent
Hanada et al.

(10) Patent No.: US 12,105,388 B2
(45) Date of Patent: Oct. 1, 2024

(54) DISPLAY DEVICE

(71) Applicant: Japan Display Inc., Tokyo (JP)

(72) Inventors: Akihiro Hanada, Tokyo (JP); Takuo Kaitoh, Tokyo (JP); Tomoyuki Ito, Tokyo (JP); Yoshinori Tanaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/509,920

(22) Filed: Nov. 15, 2023

(65) Prior Publication Data

US 2024/0160069 A1    May 16, 2024

(30) Foreign Application Priority Data

Nov. 16, 2022    (JP) .................................. 2022-183593

(51) Int. Cl.
| | |
|---|---|
| *G02F 1/1333* | (2006.01) |
| *G02F 1/13357* | (2006.01) |
| *G02F 1/1343* | (2006.01) |
| *G02F 1/1362* | (2006.01) |
| *G02F 1/1368* | (2006.01) |

(52) U.S. Cl.
CPC .. *G02F 1/136286* (2013.01); *G02F 1/133345* (2013.01); *G02F 1/133365* (2013.01); *G02F 1/133615* (2013.01); *G02F 1/134309* (2013.01); *G02F 1/1368* (2013.01)

(58) Field of Classification Search
CPC ............. G02F 1/1333; G02F 1/133345; G02F 1/133357; G02F 1/133365; G02F 1/1336; G02F 1/133615; G02F 1/1343; G02F 1/1345; G02F 1/13452; G02F 1/13454; G02F 1/13458; G02F 1/1362; G02F 1/136286

See application file for complete search history.

(56) References Cited

U.S. PATENT DOCUMENTS

2020/0273926 A1    8/2020 Lee
2021/0286226 A1    9/2021 Sugiyama et al.

FOREIGN PATENT DOCUMENTS

| JP | 2005276620 A | * 10/2005 | ............. H05B 33/22 |
|---|---|---|---|
| JP | 2020-091400 A | 6/2020 | |

OTHER PUBLICATIONS

Patent Translate JP 2005-276620 (Oct. 6, 2005).*

* cited by examiner

*Primary Examiner* — Thoi V Duong
(74) *Attorney, Agent, or Firm* — Maier & Maier, PLLC

(57) ABSTRACT

A display device includes a wiring region including a gate wiring, a source wiring intersecting the gate wiring, and a first insulating layer between the gate wiring and the source wiring and an opening region including a pixel electrode on the first insulating layer and adjacent to the wiring region. The first insulating layer includes a first oxide insulating layer and a first nitride insulating layer, the first oxide insulating layer is disposed over the wiring region and the opening region, the first nitride insulating layer is disposed in the wiring region and includes a first opening overlapping the opening region, and the pixel electrode overlaps the first opening.

6 Claims, 8 Drawing Sheets

DISPLAY DEVICE

CROSS-REFERENCE TO RELATED APPLICATIONS

This application claims the benefit of priority to Japanese Patent Application No. 2022-183593, filed on Nov. 16, 2022, the entire contents of which are incorporated herein by reference.

FIELD

An embodiment of the present invention relates to a display device and a method for manufacturing a display device.

BACKGROUND

Development of transparent displays with visible backgrounds is in progress. Since it is possible to see images from both the front and back sides of the transparent display, images or text can be viewed from two opposite directions with the transparent display in between.

Japanese Unexamined Patent Application Publication No. 2020-91400 discloses a display device with an array substrate and a counter substrate, a liquid crystal layer between them, and a light source disposed so that light enters from the side of the array substrate or counter substrate.

U.S. Patent Application Publication No. 2020/0273926 discloses a transparent display device including a base substrate and a plurality of pixels disposed on the base substrate, wherein each pixel includes an emission region and a transmission region transparent to external light and each pixel includes a circuit element layer disposed on the base substrate.

SUMMARY

A display device in an embodiment according to the present invention includes a wiring region including a gate wiring, a source wiring intersecting the gate wiring, and a first insulating layer between the gate wiring and the source wiring and an opening region including a pixel electrode on the first insulating layer and adjacent to the wiring region. The first insulating layer includes a first oxide insulating layer and a first nitride insulating layer, the first oxide insulating layer is disposed over the wiring region and the opening region, the first nitride insulating layer is disposed in the wiring region and includes a first opening overlapping the opening region, and the pixel electrode overlap the first opening.

DESCRIPTION OF EMBODIMENTS

Each embodiment of the present invention will be described below with reference to the drawings. However, it should be noted that the present invention can be carried out in various aspects without departing from the scope of the invention, and the present invention is not to be construed as limited to the descriptions of the following examples of the embodiment. The drawings may schematically represent the width, thickness, shape, and the like of each part in comparison with the actual aspect in order to make the explanation clearer, but these schematics are examples and do not limit the interpretation of the present invention. The same or similar elements in this specification and in each drawing as described with respect to the previous drawing may be assigned the same symbols and redundant descriptions may be omitted. The ordinal number used herein is for convenience in order to distinguish parts, members, and the like, and does not indicate priority or order.

When one film is processed to form a plurality of films in an embodiment of the present invention, the plurality of films may have different functions and different roles. However, the plurality of films is derived from films formed in the same layer by the same process and have the same layer structure and the same material. Therefore, it is sometimes defined that the plurality of films is in the same layer. When a single film is processed to form a plurality of films, it is sometimes described here separately from −1 and −2.

Expressions such as "above" or "upper" and "below" or "lower" in this specification express the relative positional relationship between the structure of interest and other structures. Herein, the direction from the array substrate to the counter substrate, which will be described later, is defined as "above" or "upper" and the opposite direction is defined as "below" or "lower" in the side view. The term "on" is used to describe the arrangement of other structures on top of a structure in this specification and in the claims, unless otherwise noted, including both the arrangement of other structures directly on top of a structure so as to be in contact with it and the arrangement of other structures on top of a structure through a further structure.

A bottom-gate drive, as used herein, is one in which an ON/OFF state is controlled by a gate electrode layer disposed below the semiconductor layer. A top-gate drive, as used herein, is one in which the ON/OFF state is controlled by a gate electrode layer disposed above the semiconductor layer. A dual-gate drive, as used herein, is one in which the ON/OFF state is controlled by inputting the same control signal to the gate electrode layers disposed on the top and bottom of the semiconductor layer.

A display device 10 according to an embodiment of the present invention will be described with reference to FIG. 1 to FIG. 8.

Figure 1:
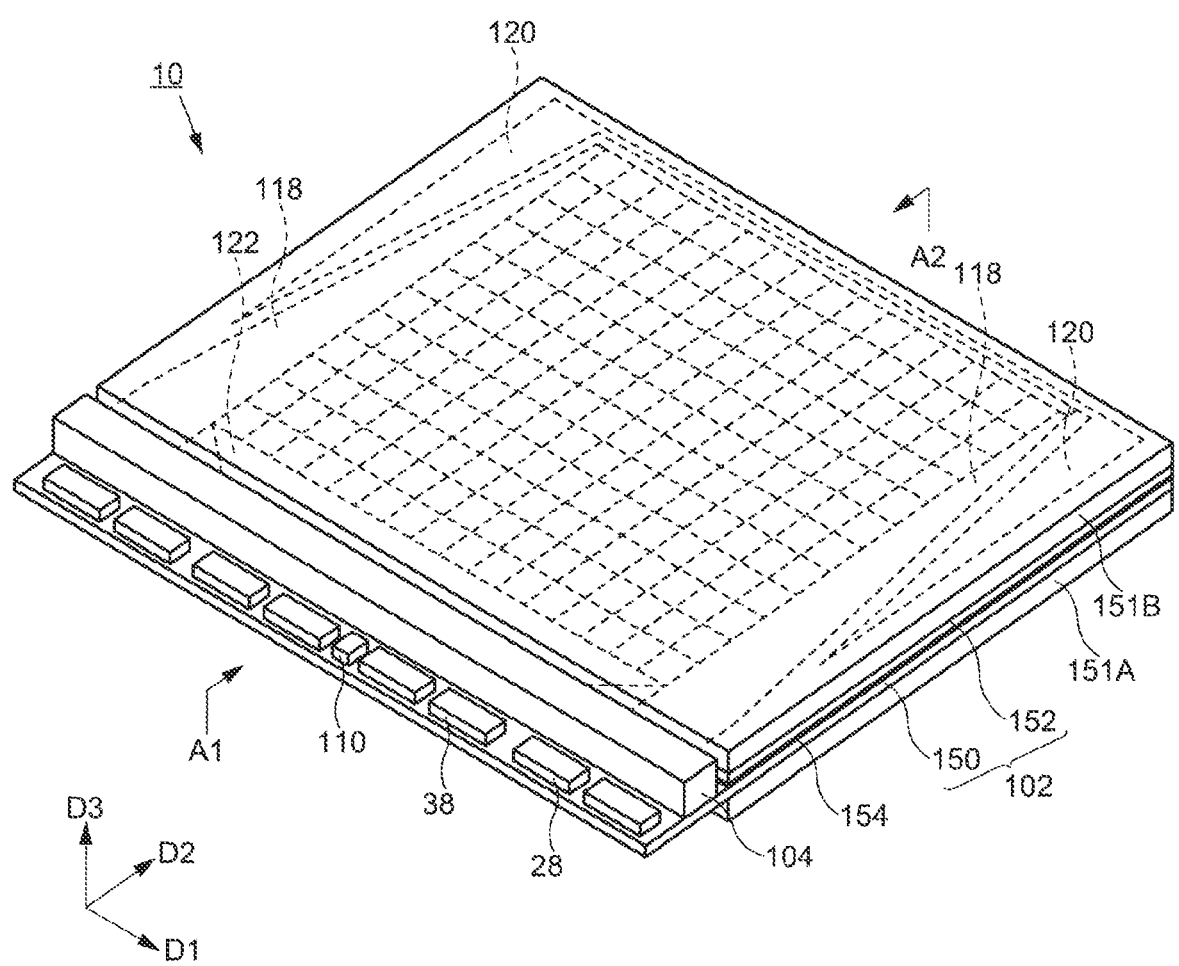
FIG. 1 is a perspective view for explaining the outline of the display device in an embodiment of the present invention.
Figure 3:
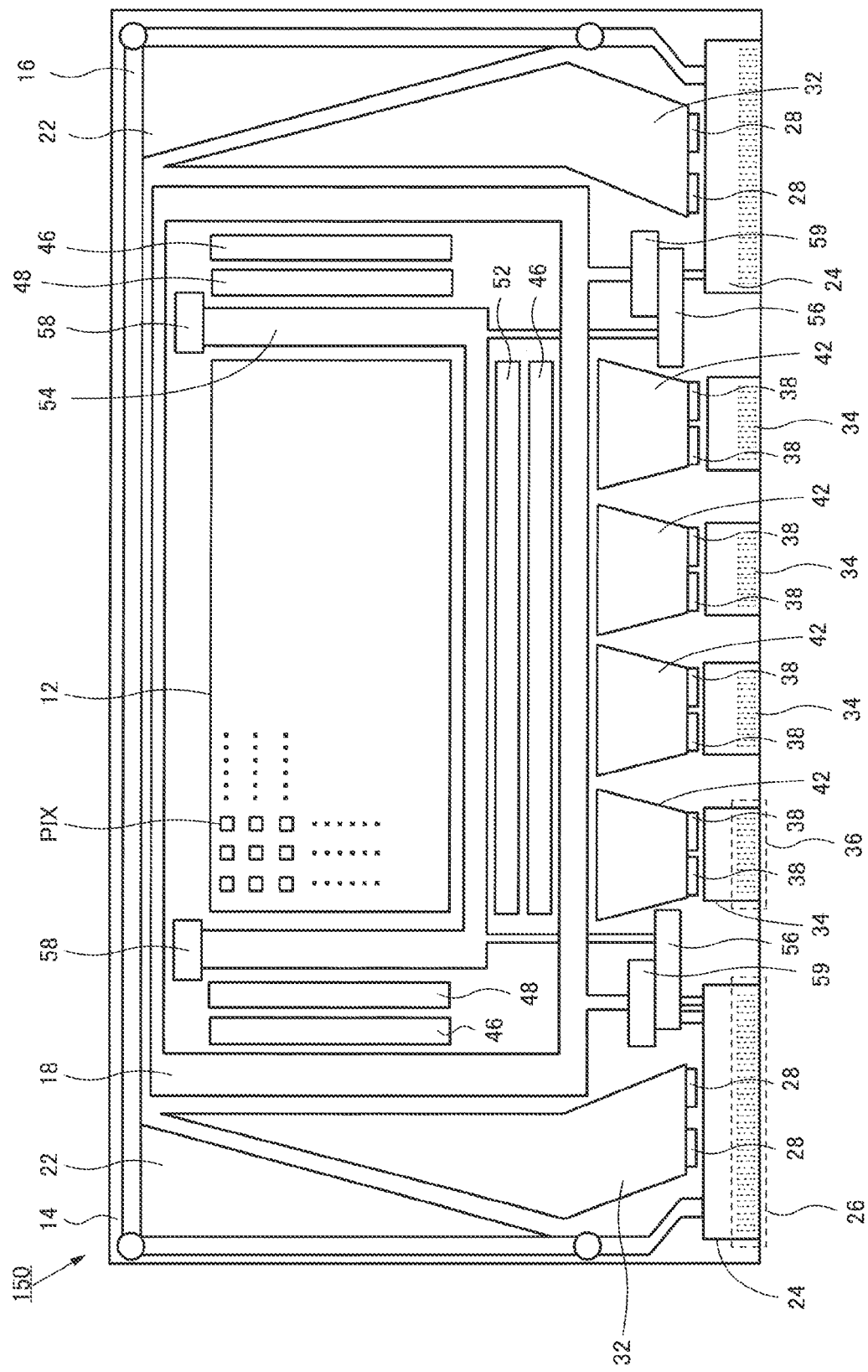
FIG. 3 is a plan view illustrating a configuration of a display device in an embodiment of the present invention.

FIG. 1 shows a diagram of the display device 10 according to an embodiment of the present invention. FIG. 3 is a plan view illustrating the configuration of an array substrate 150 of the display device 10 according to an embodiment of the present invention.

The display device 10 includes a display panel 102 including an array substrate 150, a counter substrate 152, a liquid crystal layer (not shown) between the array substrate 150 and the counter substrate 152, a gate drive circuit 28, a source drive circuit 38, a light source 104, and a first transparent substrate 151A and a second transparent substrate 151B that sandwich the display panel 102. In the following description referring to FIG. 1, one direction of the plane in the display panel 102 is the direction D1, the direction orthogonal to the direction D1 is the direction D2, and the direction orthogonal to the plane D1-D2 is the direction D3.

The array substrate 150 and the counter substrate 152 are translucent. The array substrate 150 and the counter substrate 152 are preferably transparent to visible light. The counter substrate 152 is disposed in the direction D3 opposite the array substrate 150. The array substrate 150 and the counter substrate 152 may be disposed opposite each other with a gap between them and attached together by a sealant 154.

The display panel 102 includes a display region 12 (refer to FIG. 3) and a peripheral region 14 (refer to FIG. 3) outside of the display region 12. The display region 12 is disposed with a plurality of pixels PIX (refer to FIG. 3) in the row and column directions. The row direction refers to the direction parallel to the direction D1, and the column direction refers to the direction parallel to the direction D2. The display region 12 is disposed with m pixels in the row direction and n pixels in the column direction. The values of m and n are set appropriately according to the vertical and horizontal display resolutions. The display region 12 is disposed with gate wirings (also called scanning signal lines) in the direction D1 and source wirings (also called data signal lines) in the direction D2.

The gate drive circuit 28 and source drive circuit 38 are disposed in the peripheral region 14 of the array substrate 150. FIG. 1 shows an arrangement in which the gate drive circuits 28 and the source drive circuits 38 are disposed as integrated circuits (ICs) and are mounted on the array substrate 150 in a COG (Chip on Glass) method. The gate drive circuit 28 and source drive circuit 38 are not limited to the configuration shown in the figure and may be implemented in a COF (Chip on Film) method or formed by thin-film transistors (TFT) on the array substrate 150.

A first wiring pattern 118, a second wiring pattern 120, and a third wiring pattern 122 are disposed in the peripheral region 14. The first wiring pattern 118 is a pattern formed by wiring that connects the gate drive circuit 28 and gate wirings GL which are disposed in the display region 12. The second wiring pattern 120 is a pattern formed by common wirings. The second wiring pattern 120 is used as wiring to apply a common voltage to a common electrode 218 (refer to FIG. 7) disposed on the counter substrate 152. The third wiring pattern 122 is a pattern formed by wiring that connects the source drive circuit 38 and data signal lines located in the display region 12.

The light source 104 has a structure along the direction D1. The light source 104 is configured, for example, with light emitting diodes (LEDs) arrayed along the direction D1. The detailed structure of the light source 104 is not limited and may include optical components such as reflectors, diffusers, and lenses in addition to the light emitting diodes arrayed in the direction D1. The light source 104 and a light emission control circuit 110 that controls the light source 104 may be disposed by separate components that are separate from the display panel 102, and the timing of light emission of the light source 104 may be controlled by the light emission control circuit 110 that is synchronized with the gate drive circuit 28 and the source drive circuit 38. The light emission control circuit 110 that controls the light source 104 may be disposed as a separate component, as well as the light source 104, separate from the display panel 102, and may be mounted on the array substrate 150 as a separate component, and may be incorporated into the gate drive circuit 28 or the source drive circuit 38.

The first transparent substrate 151A and the second transparent substrate 151B are disposed between the display region 12 and the peripheral region 14. The first transparent substrate 151A and the second transparent substrate 151B function as protective members for the display panel 102. As will be explained with reference to FIG. 2, the first transparent substrate 151A and the second transparent substrate 151B function as light guide plates that guide light emitted from the light source 104 into the display panel 102.

Figure 2:
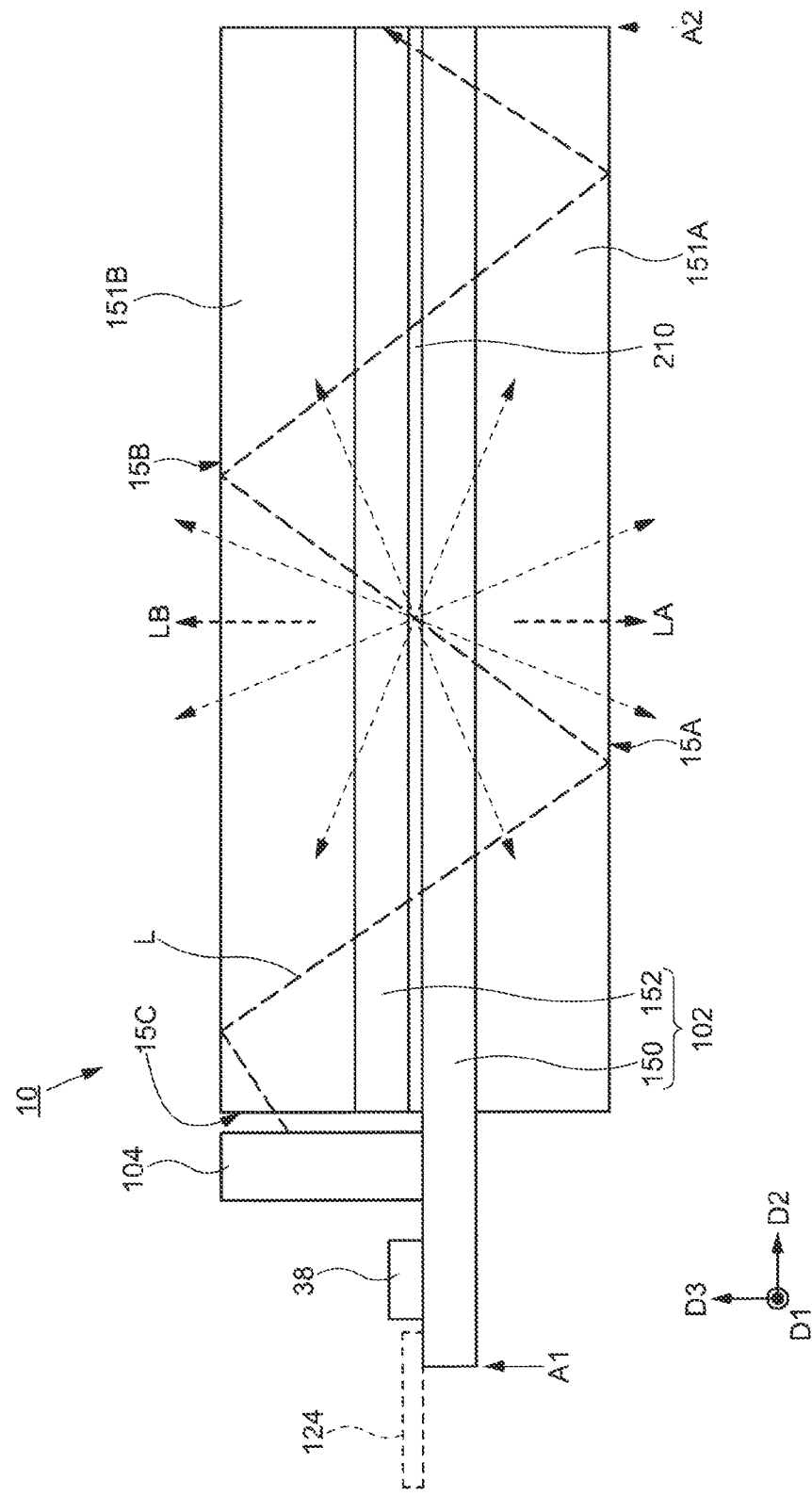
FIG. 2 is a schematic cross-sectional view showing the corresponding structure between A1-A2 of the display device shown in FIG. 1.

FIG. 2 shows a cross-sectional structure of the display device 10 corresponding to the area between A1-A2 shown in FIG. 1. As shown in FIG. 2, the first transparent substrate 151A is disposed on the array substrate 150 side of the display panel 102, and the second transparent substrate 151B is disposed on the counter substrate 152 side. A glass or plastic substrate is used for the first transparent substrate 151A and the second transparent substrate 151B. The first transparent substrate 151A and the second transparent substrate 151B should have the same refractive index as the array substrate 150 and the counter substrate 152. The array substrate 150 and the first transparent substrate 151A and the counter substrate 152 and the second transparent substrate 151B may be bonded with a transparent adhesive which is not shown in the figure.

The display panel 102 includes a liquid crystal layer 210 disposed between the array substrate 150 and the counter substrate 152. The array substrate 150 is larger than the counter substrate 152 and is sized such that a portion of the peripheral region 14 is exposed from the counter substrate 152. The drive circuits (in FIG. 2, the source drive circuit 38) are mounted on the array substrate 150. A flexible wiring substrate 124 is mounted on the periphery of the array substrate 150.

The light source 104 is disposed adjacent to one side of the first transparent substrate 151A or the second transparent substrate 151B. FIG. 2 shows a configuration in which the light source 104 is disposed along one side of the second transparent substrate 151B. FIG. 2 shows a configuration in which the light source 104 is mounted on the array substrate 150, but there is no limitation on the configuration in which the light source 104 is placed, and there is no limitation on the mounting structure as long as the mounting position can be fixed. The light source 104 may be supported, for example, by an enclosure surrounding the display panel 102.

As shown in FIG. 2, the light source 104 is disposed along a first side 15C of the second transparent substrate 151B. As shown in FIG. 2, the light source 104 emits light L to the first side 15C of the second transparent substrate 151B. The light source 104 is also referred to as a side light source because it emits light L toward the first side 15C. The first side 15C of the second transparent substrate 151B facing the light source 104 will be a light-entering surface.

As shown schematically in FIG. 2, light L incident from the first side 15C of the second transparent substrate 151B is reflected by a second plane 15B of the second transparent substrate 151B and a first plane 15A of the first transparent substrate 151A, while being propagated in a direction away from the first side 15C (direction D2). When light L travels outward from the first plane 15A of the first transparent substrate 151A and the second plane 15B of the second transparent substrate 151B, it will proceed from a medium with a large refractive index to a medium with a small refractive index. When the angle of incidence of light L incident on the first plane 15A and the second plane 15B is larger than the critical angle, the light will be totally reflected, and will be guided in the direction of D2 while being reflected by the first plane 15A and the second plane 15B.

The liquid crystal layer 210 is formed by polymer dispersed liquid crystal. The liquid crystal layer 210, which is formed of polymer dispersed liquid crystal, is controlled to be in a scattering state and a non-scattering state for each pixel PIX. As shown in FIG. 2, light L, which propagates while being reflected in the first plane 15A and the second plane 15B, is scattered at least partially when the liquid crystal layer 210 has a pixel in the scattering state, and becomes scattered at an angle of incidence smaller than the critical angle, the scattered light LA, LB are emitted externally from the first plane 15A and the second plane 15B, respectively, and the emitted scattered light LA, LB are observed by an observer. The regions of the display panel 102 other than where scattered light LA, LB are emitted are substantially transparent because the array substrate 150 and the counter substrate 152, as well as the first transparent substrate 151A and the second transparent substrate 151B, are translucent (transparent to visible light) and the liquid crystal layer 210 is in a non-scattering state, thereby, the background of the counter substrate 152 is visible from the array substrate 150 and the background of the array substrate 150 is visible from the counter substrate 152, allowing an observer to view the rear side through the display panel 102.

Referring back to FIG. 3, as mentioned above, the array substrate 150 includes a display region 12 and a peripheral region 14.

The display region 12 includes the plurality of pixels PIX disposed in a matrix. Each of the plurality of pixels PIX has a plurality of transistors and liquid crystal elements.

The peripheral region 14 is disposed to surround the display region 12. The peripheral region 14 refers to the region on the array substrate 150 from the display region 12 to the edge of the array substrate 150. In other words, the peripheral region 14 refers to the region on the array substrate 150 other than the display region 12 (that is, the region outside of the display region 12).

In addition to the gate drive circuit 28 and source drive circuit 38, the peripheral region 14 includes gate wiring regions 32 (the first wiring pattern 118 shown in FIG. 1), source wiring regions 42 (the third wiring pattern 122 shown in FIG. 1), common wirings 16, 18, 22 (the second wiring pattern 120 shown in FIG. 1), terminal parts 26, 36, flexible printed circuits 24, 34 (the flexible wiring substrate 124 shown in FIG. 2), and various inspection circuits are disposed. The terminal parts 26, 36 are disposed along one edge of the array substrate 150.

The flexible printed circuit 24 is connected to the terminal part 26. The flexible printed circuit 24 supplies various signals to the gate drive circuit 28, the common wirings 16 and 18, ESD protection circuits 59, and the QD pads 56. The gate drive circuit 28 is connected to a plurality of gate wirings GL, and each of the plurality of gate wirings GL is electrically connected to each of the plurality of pixels PIX in the display region 12. FIG. 3 shows the region where the plurality of gate wirings GL are disposed as gate wiring regions 32 (the first wiring pattern 118 shown in FIG. 1), and the detailed arrangement of the plurality of gate wirings GL is omitted from the figure. The number of gate wirings GL connected to the two gate driver circuits 28 corresponds to the number of rows of pixel PIX in the display region 12.

The gate wiring regions 32 are shown in FIG. 3 in a configuration where the gate wiring regions 32 are separated from the display region 12, whereas in reality the gate wiring GL and pixel PIX are electrically connected to each other.

The flexible printed circuits 34 are connected to the terminals 36. The flexible printed circuits 34 supply video signals to the source drive circuits 38. The source drive circuits 38 are connected to a plurality of source wirings SL, and each of the plurality of source wirings SL is electrically connected to each of the plurality of pixels PIX in the display region 12. FIG. 3 shows the region where the plurality of source wirings SL is disposed as the source wiring region 42 (the third wiring pattern 122 shown in FIG. 1), and the detailed arrangement of the plurality of source wirings SL is omitted. The number of source wirings SL connected to the eight source driver circuits 38 corresponds to at least three times the number of rows of pixels PIX in the display region 12. It is explained that in this embodiment, the number of source wirings SL is four times the number of rows of pixels PIX in the display region 12. In FIG. 3, the source wiring region 42 shows a configuration in which the source wiring is separated from the display region 12, whereas the source wiring SL is actually electrically connected to the pixel PIX.

The common wiring 18, ESD protection circuits 46, gate inspection circuits 48, and inspection lines 54 are disposed between the gate wiring region 32 and the display region 12. The common wiring 18, the ESD protection circuits 46, source inspection circuits 52, and inspection lines 54 are disposed between the source wiring region 42 and the display region 12. The inspection line 54 is connected to ESD protection circuits 58 and the QD pads 56. The common wiring 18 is connected to the ESD protection circuits 59.

The common wiring 16 is disposed around the peripheral region 14 on the array substrate 150 and is supplied with signals from the two flexible printed circuits 24. The common wiring 16 is electrically connected to the meshed common wiring 22.

Figure 4:
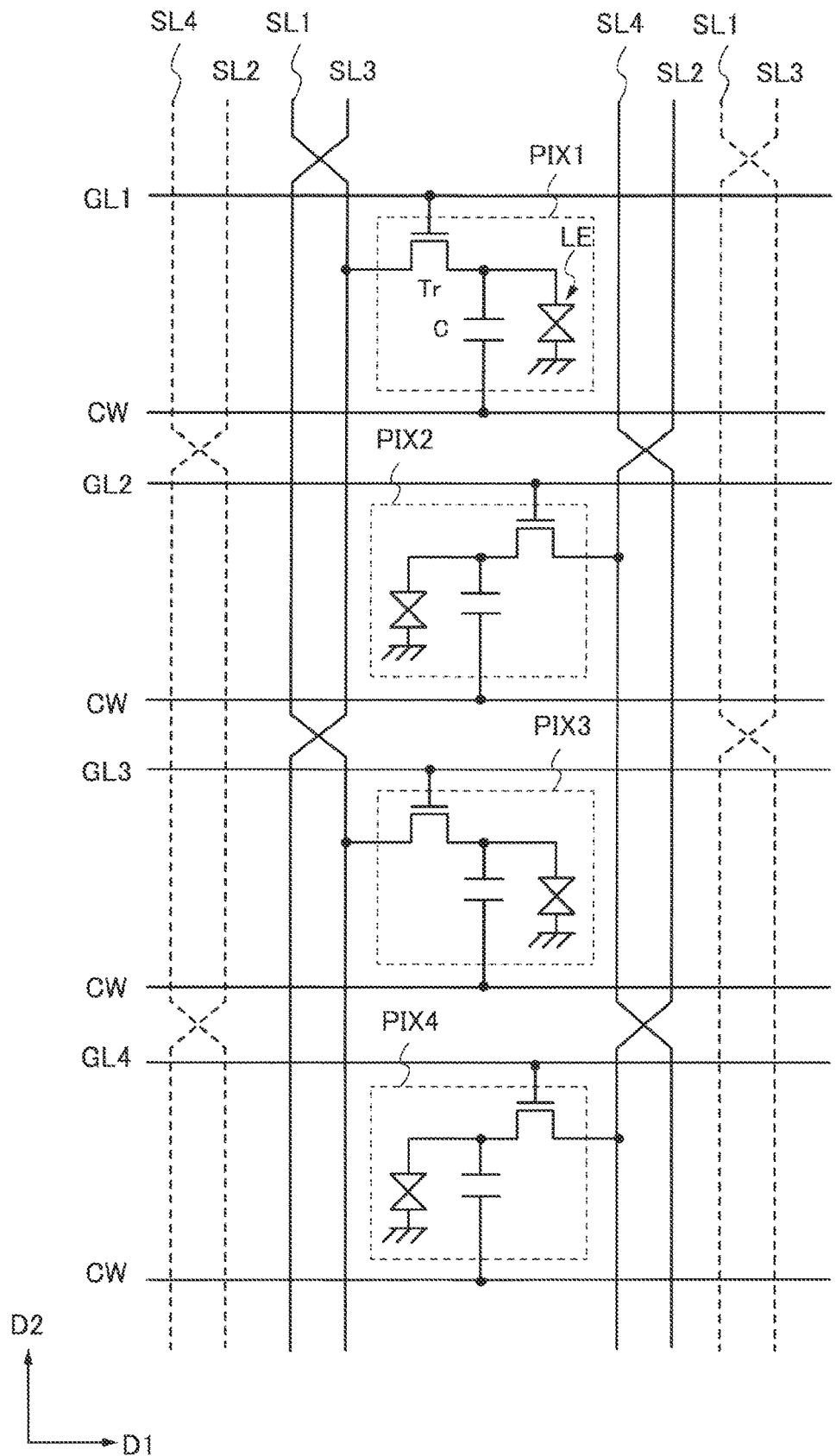
FIG. 4 is a circuit diagram showing pixels in a display device in an embodiment of the present invention.

FIG. 4 is a diagram illustrating the pixel circuit of the pixel PIX of the display device 10 according to an embodiment of the present invention. This embodiment describes the display device 10 in which the four gate wirings are supplied with an on-voltage simultaneously and the four pixels lined up in the column direction can be charged simultaneously by the four source wirings. This driving method allows one horizontal period to be longer than the line sequential horizontal period. In other words, the time required to scan all the pixel lines disposed in the display region 12 can be reduced to ¼. It is possible to ensure sufficient charging periods for pixels in high-speed drive panels, such as transparent displays, and in large or high-definition panels. The configuration of the pixel in this embodiment is described in detail below.

In FIG. 4, four pixels PIX1 to PIX4 are disposed in the column direction (in the direction D2). Each of the four pixels PIX1 to PIX4 is electrically connected to each of the four gate wirings GL1 to GL4. Each of the four pixels PIX1 to PIX4 is electrically connected to each of the four source wirings SL1 to SL4. Each of the four pixels PIX1 to PIX4 is connected to the capacitance wirings CW. In the following description, each of the pixels PIX1 to PIX4 is described as pixel PIX when they are not distinguished from each other. When each of the gate wirings GL1 to GL4 and the source wirings SL1 to SL4 are also not distinguished, they are described as gate wiring GL and source wiring SL.

The pixels PIX include a transistor Tr, a liquid crystal element LE, and a retention capacitor C. A gate of the transistor Tr is connected to the gate wiring GL, a source of the transistor Tr is connected to the source wiring SL, and a drain of the transistor Tr is connected to one electrode of the liquid crystal element LE and one electrode of the holding capacitor C. The other electrode of the liquid crystal element LE is connected to the common wiring CL. The other electrode of the retention capacitor C is connected to the capacitance wiring CW.

The transistor Tr has a function of controlling the writing time of the video signal supplied from the source wiring to the pixel by switching between the on state and off state. When the transistor Tr is turned on, a potential corresponding to the video signal supplied from the source wiring can be written into the retention capacitor C electrically connected to the transistor Tr. The potential held in the retention capacitor C can be retained by turning the transistor Tr to the off state.

Figure 5:
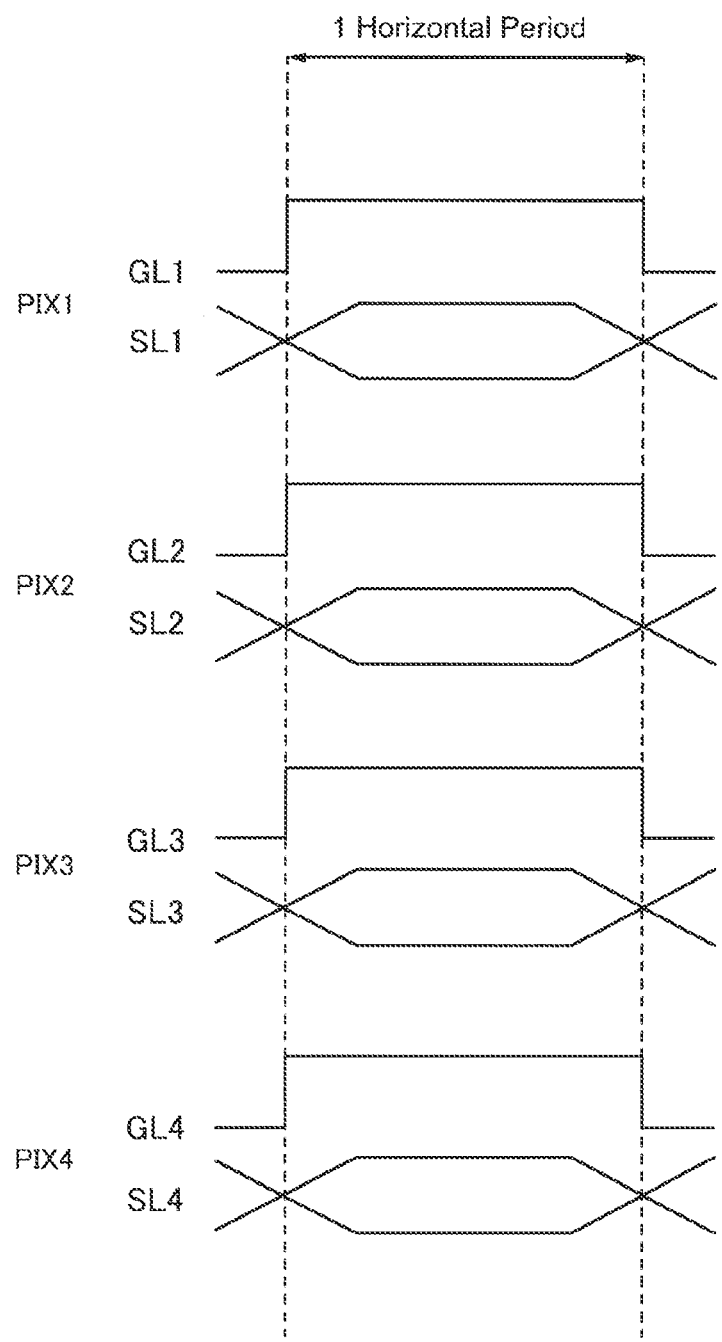
FIG. 5 is a timing chart explaining a method of driving pixels in a display device in an embodiment of the present invention.

FIG. 5 shows a timing chart of a display device 10 according to an embodiment of the present invention. Normally, the gate wirings GL are supplied with an ON voltage one row at a time to sequentially charge the pixel rows lined up in the direction of D2 with the same source wiring. In contrast, in this embodiment, the ON voltage is supplied to the four gate wirings GL simultaneously, so that the transistor Tr in each of the four pixels is in the ON state simultaneously. In this state, video signals are supplied simultaneously to the different source wirings SL1 to SL4. This makes it possible to drive the four pixels lined up in the direction D2 at the same time.

As shown in FIG. 4, the source wiring SL1 and the source wiring SL3, and the source wiring SL2 and the source wiring SL4 are disposed across one row of pixels. In other words, four source wirings SL1 to SL4 are disposed between one row of pixels.

There is a region where the source wiring SL1 and the source wiring SL3 cross each other. There is a region where the source wiring SL2 and the source wiring SL4 cross each other. In other words, the source wiring SL1 and the source wiring SL3 are interchanged and the source wiring SL2 and the source wiring SL4 are interchanged. It is possible to make the resistance and capacitance of the source wirings SL1 to SL4 more uniform. As a result, it is possible to suppress defects caused due to static electricity during the manufacturing of the display panel.

Figure 6:
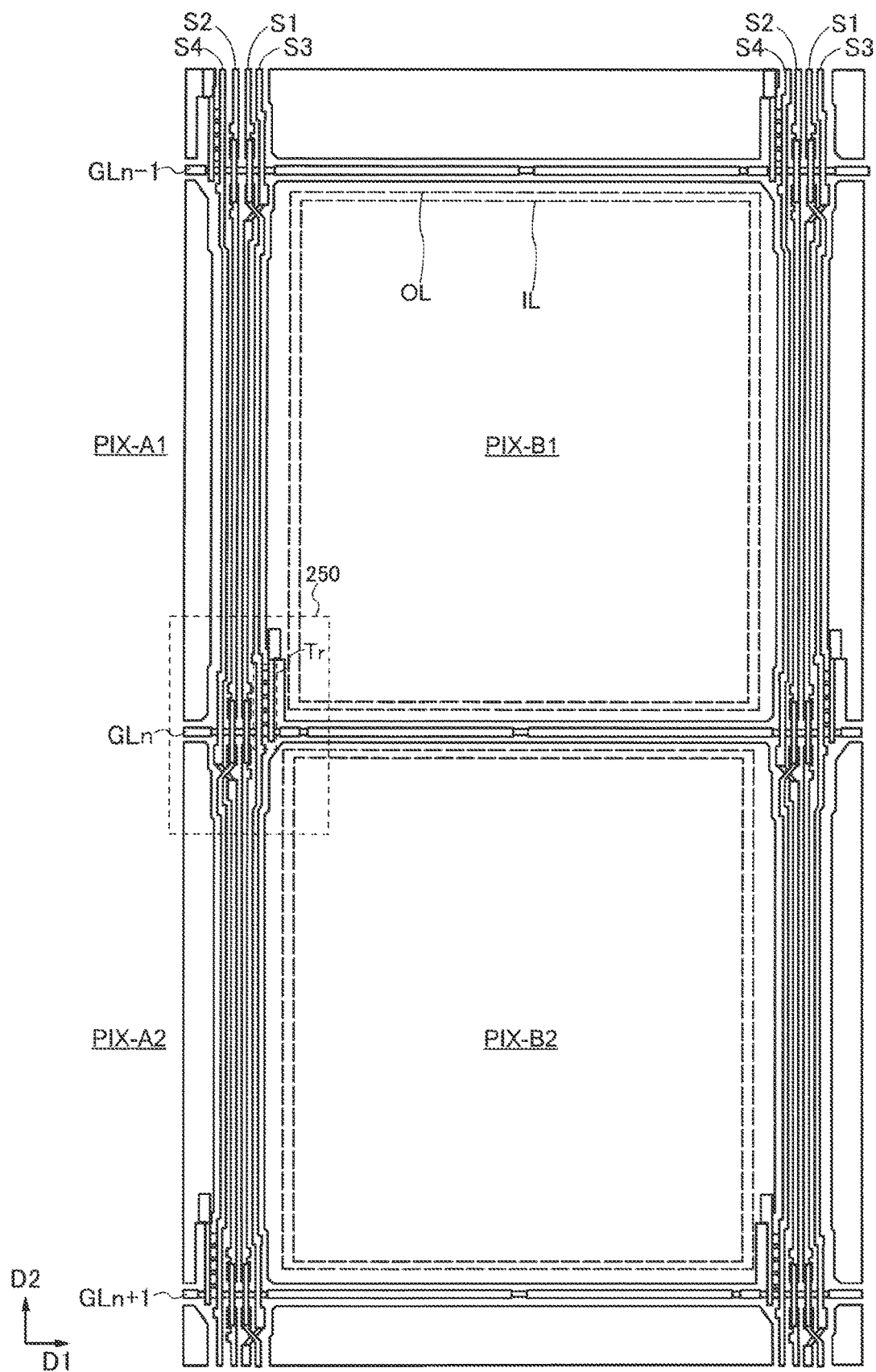
FIG. 6 is a planar layout of pixels in a display device in an embodiment of the present invention.

FIG. 6 shows a planar layout of pixels PIX in the display device 10 according to an embodiment of the present invention. A configuration of pixels PIX-B1, PIX-B2 in a plan view is shown in FIG. 6.

As shown in FIG. 6, the gate wirings GLn−1 to GLn+1 is disposed along the first direction D1. The source wirings S1 to S4 are disposed along the second direction D2. Here, an opening region of the pixel PIX-B1 is the region surrounded by the adjacent the gate wiring GLn−1, the gate wiring GLn, the source wiring S3, and the source wiring S4. The pixel PIX-B1 is controlled by the transistor Tr disposed in the region 250.

Although FIG. 6 shows four source wirings S1 to S4 disposed around the pixel PIX, the number of source wirings is not limited, for example, only one source wiring may be disposed around the pixel PIX.

As shown in FIG. 6, each pixel PIX can be divided into a wiring region with a gate wiring GL or source wiring SL around it and the opening region adjacent to the wiring region and without such wiring. The opening region can transmit external light from the back of the substrate, and the display region 12 appears to be transparent when external light illuminates it from the back.

In FIG. 6, the double dashed line in the opening region indicates the edge of the film that is removed in the opening among the insulating layers stacked in the wiring region, which will be described later. This indicates that a part of the insulating layer stacked in the wiring region is removed in the opening region in the inner part. For example, the outer dashed line OL represents the edge of the first nitride insulating layer 203a (refer to FIG. 7) in a first insulating layer 203 (gate insulating layer), and the inner dashed line IL represents the edge of a second nitride insulating layer 205b as the second insulating layer 205 (passivation layer) (refer to FIG. 7).

As described below, a first nitride insulating layer 203a (refer to FIG. 7) in the first insulating layer 203 (gate insulating layer) is removed in the opening region with the dashed line OL as a boundary, and the removed portion is called the first opening. A second nitride insulating layer 205b as the second insulating layer 205 (passivation layer) may also be removed with the dashed line IL as a boundary (refer to FIG. 7), and the removed portion is called the second opening. However, the second nitride insulating layer 205b may be left without being removed, in which case the second opening will not exist (refer to FIG. 8).

Figure 7:
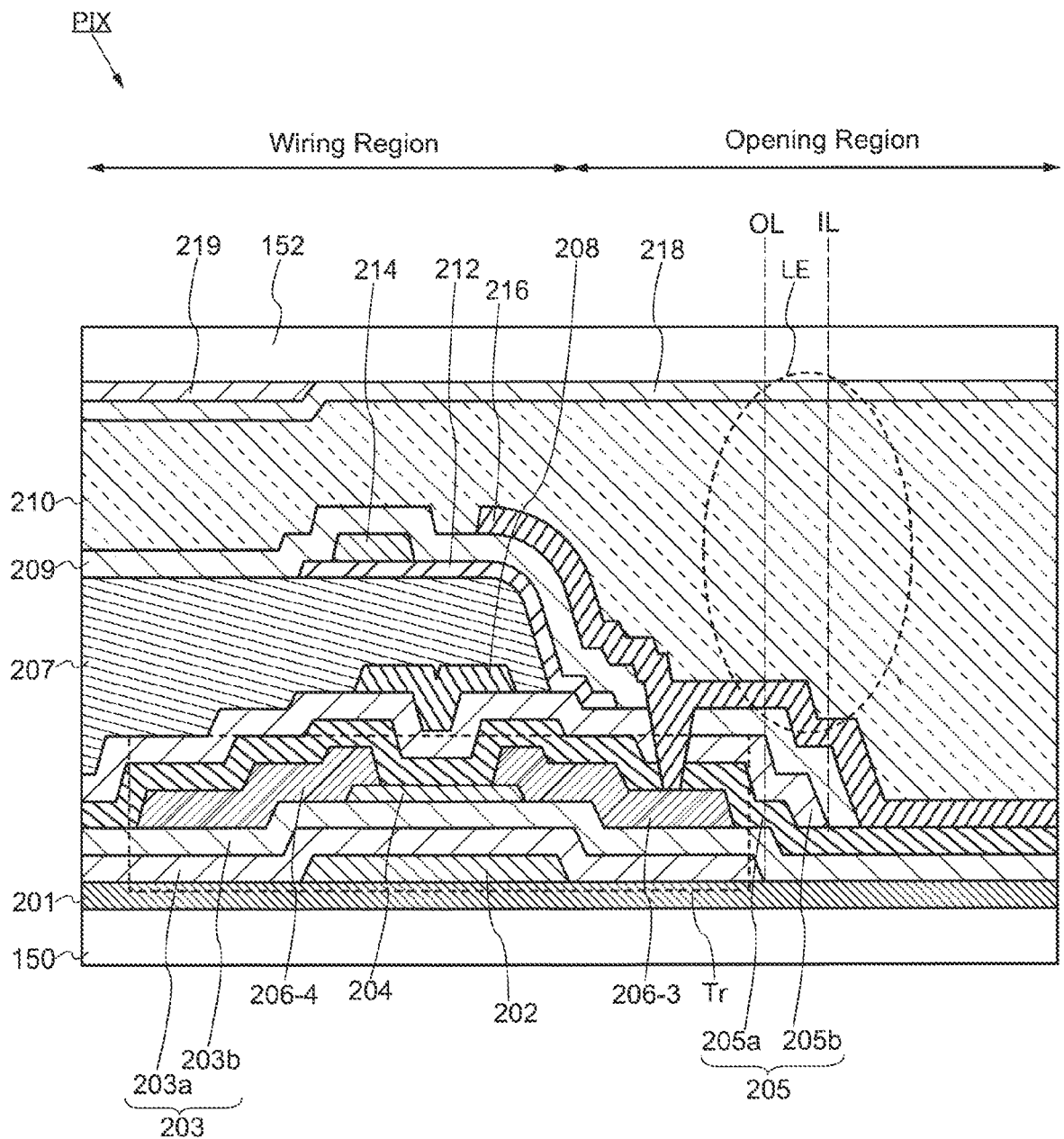
FIG. 7 is a cross-sectional view of a pixel in a display device in an embodiment of the present invention.

A stacking structure of the pixel PIX in the display device 10 according to an embodiment of the present invention will be described. FIG. 7 is a schematic diagram of a cross-section of the pixel PIX in the display device 10 according to an embodiment of the present invention.

As described above, the pixel PIX include the opening region (FIG. 7, right side), which transmits outside light, and other wiring regions (FIG. 7, left side). The transistor Tr, the gate wiring GL and the source wiring SL and most of the other wiring are disposed in the wiring region.

As shown in FIG. 7, the transistor Tr is disposed on the array substrate 150. The transistor Tr includes a conductive layer 202 disposed on the array substrate 150, an oxide semiconductor layer 204 disposed counter to the conductive layer 202, a first insulating layer 203 disposed between the conductive layer 202 and the oxide semiconductor layer 204, and a conductive layer 206-3 and a conductive layer 206-4 disposed on the oxide semiconductor layer 204. The conductive layer 202 functions as the gate wiring GL (gate electrode layer), and the conductive layer 206-4 functions as the source wiring SL (source electrode layer). In this embodiment, an example of using a bottom-gate type transistor as the transistor Tr is described.

A translucent oxide semiconductor is used as the semiconductor layer for the transistor Tr that configures the transparent display. The oxide semiconductors are easily subject to oxygen defects during film deposition. Therefore, it is preferable to provide an oxide insulating layer and an oxide semiconductor layer in contact with each other in order to repair oxygen defects. Since the oxide semiconductor layer and the oxide insulating layer are in contact with each other, oxygen defects can be repaired by oxygen released from the silicon oxide film during heat treatment in the manufacturing process of transparent displays. For example, it is preferable to use silicon oxide as the oxide insulating layer in contact with the oxide semiconductor layer.

When using a silicon oxide layer as a gate insulating layer in a bottom-gate structure transistor, the silicon oxide layer may come in contact with the array substrate. However, there is a risk that impurity elements contained in the array substrate may reach the oxide semiconductor layer through the silicon oxide layer. When a silicon nitride layer and a silicon oxide layer are stacked from the gate electrode layer side as the gate insulating layer, the silicon nitride layer can block some impurity elements in the array substrate by contacting the array substrate.

When a nitride insulating layer such as silicon nitride and an oxide insulating layer such as silicon oxide are stacked as the first insulating layer (gate insulating layer), the chromaticity fluctuation of the transparent display is increased due to the difference in refractive index between the nitride insulating layer and the oxide insulating layer. Therefore, as described below, part or all of the nitride insulating layer can be removed from the insulating layer in the opening region, in the embodiment of the present invention.

A base insulating layer 201 may be formed between the array substrate 150 and the conductive layer 202. The base insulating layer 201 in the wiring region is formed of silicon oxide, silicon nitride, or the like, and has a film thickness of 50 nm or more and 300 nm or less, preferably 100 nm or more and 200 nm or less.

The first nitride insulating layer 203a and the first oxide insulating layer 203b are disposed between the conductive layer 202 and the conductive layer 206-4 as part of the first insulating layer 203. A thickness of the first nitride insulating layer 203a in the wiring region is 100 nm or more and 500 nm or less, preferably 200 nm or more and 400 nm or less, and a thickness of the first oxide insulating layer 203b is 20 nm or more and 400 nm or less, preferably 100 nm or more and 300 nm or less. The overall film thickness of the first insulating layer 203 in the wiring region is, for example, preferably 120 nm or more and 900 nm or less, preferably 300 nm or more and 600 nm or less.

The second insulating layer 205 is disposed above the transistor Tr. The second insulating layer 205 functions as a passivation layer. The second insulating layer 205 is configured with a second oxide insulating layer 205a and a second nitride insulating layer 205b. The oxygen defects in the oxide semiconductor layer 204 can be repaired when oxygen is released from the first oxide insulating layer 203b and second oxide insulating layer 205a during the process, by sandwiching the oxide semiconductor layer 204 between the second oxide insulating layer 205a and the first oxide insulating layer 203b.

A thickness of the second nitride insulating layer 205b used as the second insulating layer 205 (passivation layer) is 50 or more and 400 nm or less, preferably 50 or more and 200 nm or less, and a thickness of the second oxide insulating layer 205a is 100 or more and 500 nm or less, preferably 200 or more and 400 nm or less. The overall thickness of the second insulating layer 205 is, for example, 150 nm or more and 900 nm or less, preferably 300 nm or more and 600 nm or less, in the wiring region.

A conductive layer 208 is disposed on the second insulating layer 205 at a position opposite the oxide semiconductor layer 204. The conductive layer 208 functions as a back gate electrode. Although the transistor Tr is described in this embodiment as being a bottom gate drive transistor, the transistor Tr is not limited to this and may be a top gate drive transistor or a dual gate drive transistor.

A planarization layer 207 may be disposed on top of the conductive layer 208 and the second insulating layer 205. The planarization film 207 is disposed to mitigate the unevenness of the various wirings configuring the transistor Tr. When the display device 10 is applied to a transparent display, the planarization film 207 should be removed in the opening region of the pixel PIX. It is thereby possible to prevent light from being absorbed by the planarization film 207 in the opening region.

A transparent conductive layer 212 is disposed on top of the planarization layer 207 and the second insulating layer 205. A conductive layer 214 is disposed over the transparent conductive layer 212. The transparent conductive layer 212 and the conductive layer 214 function as capacitive wiring CW (refer to FIG. 4). An insulating layer 209 (capacitive insulating layer) is disposed above the transparent conducting layer 212 and the conductive layer 214. A pixel electrode 216 is disposed on top of the insulating layer 209. The pixel electrode 216 is connected to the conductive layer 206-3 through an opening in the second insulating layers 205, 209, and overlaps the opening region. A thickness of the insulating layer 209 (capacitive insulating layer) is 100 nm to 300 nm, preferably 150 nm to 250 nm. The insulating layer 209 may be removed in the opening region.

The counter substrate 152 is disposed opposite the array substrate 150. A light shielding layer 219 and a common electrode 218 are disposed on the counter substrate 152. The light shielding layer 219 functions as a black matrix. In the structure shown in FIG. 7, the light shielding layer 219 is disposed in a region overlapping the conductive layer 206-4. The light shielding layer 219 is disposed in a grid pattern to cover the gate wiring GL and the source wiring SL1 to source wiring SL4. The common electrode 218 has a size that extends over the entire surface of the display region 12. The light shielding layer 219 may be formed of a metal film and is disposed in contact with the common electrode 218, which is formed of a transparent conductive layer, to function as an auxiliary electrode. The liquid crystal layer 210 is disposed between the array substrate 150 and the counter substrate 152, and may be sealed by the sealant 154 (refer to FIG. 1). The pixel electrode 216, the liquid crystal layer 210, and the common electrode 218 configure the liquid crystal element LE.

The cross-section of the opening region is described with reference to FIG. 7. In conventional transparent displays, the insulating layers used in the wiring region were laminated on the array substrate 150 even in an aperture region where external light is transmitted. That is, the base insulating layer 201 is formed, and the first insulating layer 203 (gate insulating layer) consisting of the first nitride insulating layer 203a and the first oxide insulating layer 203b is formed on the base insulating layer 201, in the conventional transparent displays. Furthermore, the second insulating layer 205 (passivation layer) consisting of the second oxide insulating layer 205a and the second nitride insulating layer 205b is formed on the first insulating layer 203. In addition, the insulating layer 209 (capacitive insulating layer) was formed on the second insulating layer 205, and the conductive layer 216 as the pixel electrode was formed on top of the insulating layer 209.

However, for the material of the insulating layer formed in the opening region, it is preferable to use a material with a small refractive index difference between the insulating layers or between the insulating layers and the array substrate 150 or the counter substrate 152 in order to reduce the effect on transmitted light due to interference of light between each layer in the insulating layers. From this perspective, with respect to the insulating layer in the opening region, it is preferable to remove the nitride insulating layer from any one of the insulating layers stacked in the wiring region.

In the configuration represented in FIG. 7, all nitride insulating layers are removed from the insulating layers used in the wiring region, in the opening region. That is, over the opening region, only the first oxide insulating layer 203b, which configures the first insulating layer 203, and the second oxide insulating layer 205a, which configures the second insulating layer 205, remain as insulating layers on the base insulating layer 201, and the pixel electrode 216 is formed thereon.

Here, the outer dashed line OL represents the edge of the first nitride insulating layer 203a and the inner dashed line IL represents the edge of the second nitride insulating layer 205b in the dashed line of the opening region in FIG. 6, as mentioned above. The portion of the opening region where the first nitride insulating layer 203a is removed (to the right of OL in FIG. 7) is called the first opening, and the portion where the second nitride insulating layer 205b is removed (to the right of IL in FIG. 7) is called the second opening. In FIG. 7, the opening region overlaps the first opening and the second opening, with the first opening and the second opening overlapping for the most part. The configuration shown in FIG. 6 and FIG. 7 is not limited to this positional relationship, although the second opening is positioned more inwardly than the first opening in the opening region.

The opening regions formed in this way can exhibit good translucency because the chromaticity fluctuations caused by the refractive index difference between the oxide insulating layer and the nitride insulating layer are suppressed.

Figure 8:
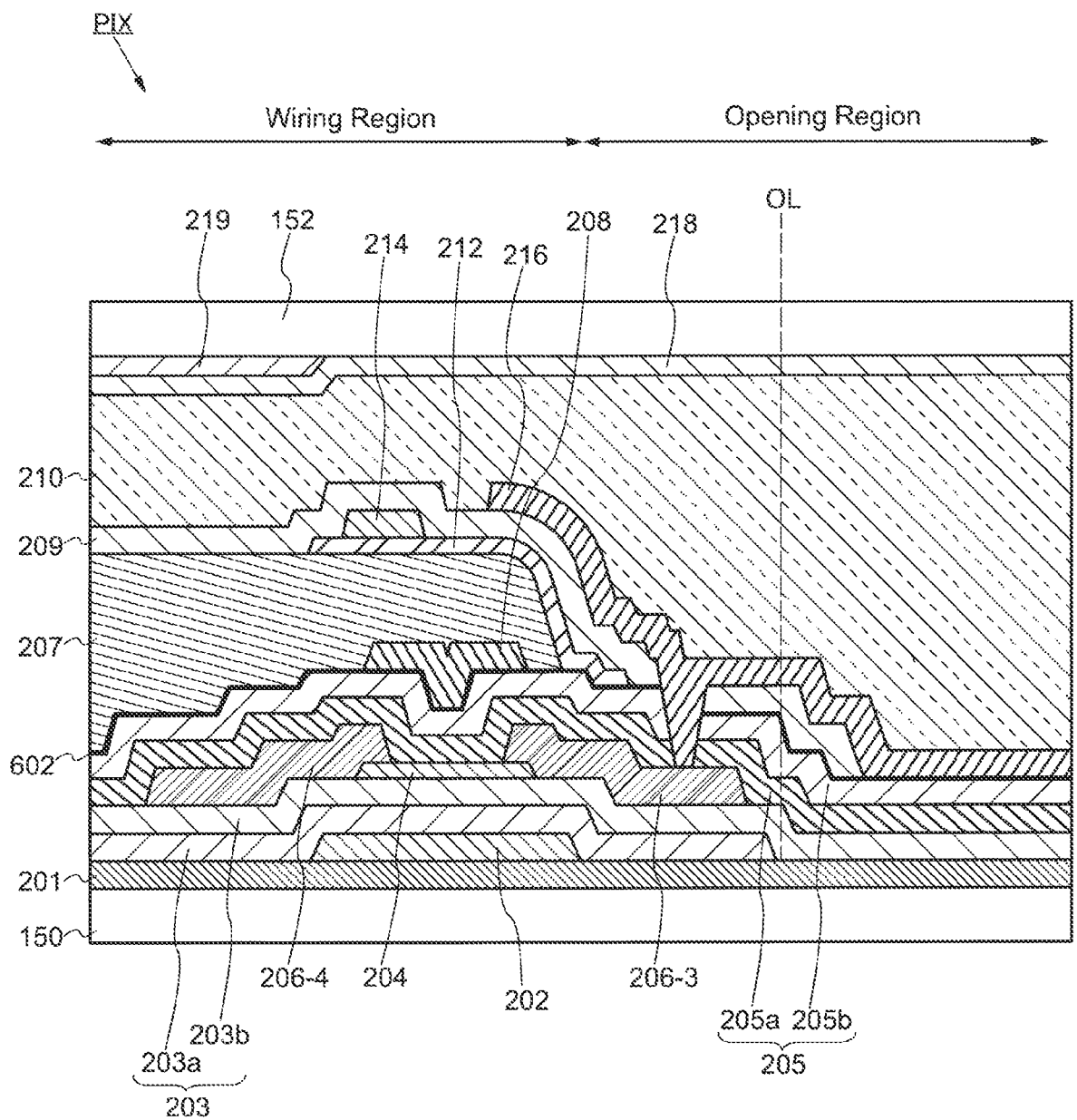
FIG. 8 is a cross-sectional view of a pixel in a display device in an embodiment of the present invention.

FIG. 8 shows a cross-sectional view of a pixel in another embodiment of the present invention. In this aspect, the second nitride insulating layer 205b, which configures the second insulating layer 205, is left in place. The second nitride insulating layer 205b which configures the second insulating layer 205 may need to be left in priority over the nitride insulating layers in other insulating layers in order to effectively prevent transistor characteristic changes in the wiring region.

Among the insulating layers used in pixel PIX, the first nitride insulating layer 203a, which configures the first insulating layer 203, has a large effect on chromaticity fluctuations, and simply removing this first nitride insulating layer 203a can greatly improve chromaticity fluctuations.

When the second nitride insulating layer 205b, which configures the second insulating layer 205, is left, a new capped oxide layer 602 can be disposed on the second nitride insulating layer 205b. When a nitride insulating layer is used as the insulating layer 209 that serves as the upper layer of the second nitride insulating layer 205b, the capped oxide layer 602, which has etching resistance, is preferably disposed on the second nitride insulating layer 205b so that the second nitride insulating layer 205b in the opening region is not removed together in the etching removal process of insulating layer 209.

Thus, when the second nitride insulating layer 205b is left, there is no second opening.

A rigid substrate that is translucent and not flexible, such as glass, quartz, and sapphire substrates, can be used as the array substrate 150 and the counter substrate 152. On the other hand, when the array substrate 150 and the counter substrate 152 need to be flexible, flexible substrates that contain resin and have flexibility, such as polyimide, acrylic, siloxane, or fluoropolymer substrates, can be used as the array substrate 150 and the counter substrate 152. To improve the heat resistance of the array substrate 150 and the counter substrate 152, impurities may be added to the above resin. When the display device 10 is applied to transparent displays or large or high-definition displays, it is preferable to use glass substrates as the array substrate 150 and the counter substrate 152. For the first transparent substrate 151A and the second transparent substrate 151B, these substrates are disposed to protect the array substrate 150 and the counter substrate 152. Therefore, a translucent glass substrate or a plastic substrate, for example, should be used for the first transparent substrate 151A and the second transparent substrate 151B.

Silicon nitride ($SiN_x$), silicon nitride oxide ($SiN_xO_y$), aluminum nitride ($AlN_x$), aluminum nitride oxide ($AlN_xO_y$), are used as the insulating layers 201, 203a, 205b, and the insulating layer 209. In this embodiment, silicon nitride is used as the nitride insulating layers 201, 203a, 205b, and the insulating layer 209. The silicon nitride layer is formed, for example, by the vapor deposition (CVD) method.

Silicon oxide ($SiO_x$), silicon nitride oxide ($SiO_xN_y$), aluminum oxide ($AlO_x$), aluminum nitride oxide ($AlO_xN_y$), are used as the first oxidation insulating layer 203b and second oxidation insulating layer 205a. In this embodiment, silicon oxide is used as the first oxide insulating layer 203b and the second oxide insulating layer 205a. The silicon oxide layers are formed, for example, by the CVD method.

The above $SiO_xN_y$ and $AlO_xN_y$ are silicon and aluminum compounds containing a smaller ratio (x>y) of nitrogen (N) than oxygen (O). $SiN_xO_y$ and $AlN_xO_y$ are silicon and aluminum compounds containing a smaller proportion (x>y) of oxygen than nitrogen.

Organic insulating materials such as polyimide resin, acrylic resin, epoxy resin, silicone resin, fluorine resin, or siloxane resin can be used as the planarization film 207.

The capped oxide layer 602 can preferably be composed of silicon oxide. It is preferable that the film is sufficiently thinner than the adjacent nitride film, for example, 10 nm or more and 50 nm or less.

Common metallic materials can be used as conductive layers 202, 206-3, 206-4, 208, and 214. For example, aluminum (Al), titanium (Ti), copper (Cu), chromium (Cr), cobalt (Co), nickel (Ni), molybdenum (Mo), hafnium (Hf), tantalum (Ta), tungsten (W), bismuth (Bi), silver (Ag), and their alloys or compounds are used. The above materials may be used in a single layer or in a laminate as the above components.

An oxide semiconductor having semiconductor properties can be used as the oxide semiconductor layer 204. The oxide semiconductor layer 204 has translucency. For example, an oxide semiconductor containing two or more metals including indium (In) is used as the oxide semiconductor layer 204. For example, an oxide semiconductor including indium (In), gallium (Ga), zinc (Zn), and oxygen (O) may be used as the oxide semiconductor layer 204. In particular, an oxide semiconductor having a composition ratio of In:Ga:Zn:O=1:1:1:4 may be used. However, the oxide semiconductor layer 204 used in this embodiment is not limited to the above composition, and an oxide semiconductor with a composition different from the above may also be used.

For example, the ratio of In may be larger than the above to improve mobility. The ratio of Ga may be larger than the above to increase the band gap and reduce the effect of light irradiation. The oxide semiconductor layer 204 may be amorphous or polycrystalline. The oxide semiconductor layer 204 may be a mixture of amorphous and crystalline phases.

A compound of indium oxide and tin oxide (ITO) and a compound of indium oxide and zinc oxide (IZO) may be used as the transparent conductive layer 212, the pixel electrode 216, and the common electrode 218. Materials other than those listed above may be used as transparent conductive layers. The light shielding layer 219 used for the black matrix BM can be formed of black resin or metal material. The black matrix BM is formed in contact with the common electrode 218. In contrast to the common electrode 218 formed with a transparent conductive film, the black matrix BM can function as an auxiliary electrode to reduce resistance loss by forming the black matrix BM with a metallic material. Chromium, molybdenum, titanium, etc., which have relatively low reflectance compared to aluminum, may be used as the metallic material to form the black matrix BM, either as a single layer or in a laminate. When the black matrix has a stacked structure, it may include a layer of aluminum.

When the display device 10 is applied to a transparent display, it is preferable to use the polymer dispersed liquid crystals as the liquid crystal layer 210. The polymer dispersed liquid crystal includes a bulk and microparticles. The microparticles align in the bulk according to the potential difference between the pixel electrode 216 and the common electrode 218. The degree of at least one of translucency and dispersion is controlled for each pixel PIX by controlling the potential of the pixel electrode 216 individually for each pixel PIX. The degree of scattering of the liquid crystal layer (particulates) is controlled according to the voltage of each pixel electrode 216 and the voltage of the common electrode 218. For example, the liquid crystal layer may use a polymer dispersed liquid crystal such that the degree of scattering increases as the voltage between each pixel Pix and the common electrode 218 increases, or a polymer dispersed liquid crystal such that the degree of scattering increases as the voltage between each pixel electrode 216 and the common electrode 218 decreases.

The normal light refractive indices of the bulk and microparticles are equal to each other in the liquid crystal layer 210. When a voltage is not applied between the pixel electrode 216 and the common electrode 218, the refractive index difference between the bulk and the fine particles is close to zero in all directions. The liquid crystal layer 210 becomes a non-scattering state (transparent state) that does not scatter the light emitted from the light source 104. The light emitted from the light source 104 propagates in a direction away from the light source 104 while being reflected by the first plane 15A of the first transparent substrate 151A and the second plane 15B of the second transparent substrate 151B. When the liquid crystal layer 210 is in a non-scattering state (transparent state) that does not scatter the light L emitted from the light source 104, the background of the counter substrate 152 is visible from the array substrate 150 and the background of the array substrate 150 is visible from the counter substrate 152.

The optical axis of the fine particles become tilted by the electric field generated between the pixel electrode 216 applied with voltage and the common electrode 218. Since the optical axis of the bulk is not changed by the electric field, the orientation of the optical axis of the bulk and the optical axis of the fine particles are different from each other. Light emitted from the light source 104 is scattered at the pixel PIX where the pixel electrode 216 to which a voltage is applied is located. As described above, when a part of the light emitted from the light source 104 is scattered, it is emitted to the outside from the array substrate 150 and the counter substrate 152 and observed by the observer.

The background on the counter substrate 152 side is visible from the array substrate 150 side and the background on the array substrate 150 side is visible from the counter substrate 152 side in the pixel PIX with the pixel electrode 216 to which a voltage is not applied. When a video signal is input to the display device 10 of the present embodiment, a voltage is applied to the pixel electrodes 216 of the pixel PIX where the image is displayed, and the image based on the video signal is visible together with the background. Thus, when the polymer dispersed liquid crystal is in a scattering state, the image is displayed in the display region 12.

EXAMPLE

This example describes an optical simulation performed on chromaticity fluctuation by changing the configuration of the insulating layer and each of the insulating layers included in the insulating layer.

An optical simulation model was performed for a display having the configuration shown in Examples 1 and 2 and Comparative Example A in Table 1 below for the opening region of pixel PIX. Example 1 is an example in which all nitride films are removed (corresponding to FIG. 7), Example 2 is an example in which the nitride insulating layer 203a of the first insulating layer and the nitride insulating layer 209 that serves as the capacitance insulating layer are removed (corresponding to FIG. 8), and Comparative Example A represents the conventional film configuration without removing the nitride films.

The silicon oxide and silicon nitride used as the insulating layers had refractive indices of 1.47 and 2.02 at a wavelength of 630 nm, respectively.

TABLE 1

| Component | Example 1 | Example 2 | Comparative Example A |
|---|---|---|---|
| Glass | 700 µm | 700 µm | 700 µm |
| ITO | 35 nm | 35 nm | 35 nm |
| Liquid Crystal | 3150 nm | 3150 nm | 3150 nm |
| ITO | 50 nm | 50 nm | 50 nm |
| Silicon Nitride (LT) | none | none | 220 nm |
| Silicon Oxide (CAP) | none | 30 nm | none |
| Silicon Nitride (PAS) | none | 100 nm | 100 nm |
| Silicon Oxide (PAS) | 300 nm | 300 nm | 300 nm |
| Silicon Oxide (GI) | 200 nm | 200 nm | 200 nm |
| Silicon Nitride (GI) | none | none | 300 nm |
| Glass | 500 µm | 500 µm | 500 µm |

In Table 1, GI represents a gate insulating layer (first insulating layer), PAS represents a passivation layer (second insulating layer), LT represents a capacitance insulating layer, and CAP represents a capped oxide layer.

To check the chromaticity fluctuation in the opening region of the plurality of pixels PIX, an optical simulation was performed to calculate the chromaticity using the transfer matrix method.

As a result, there was no difference in chromaticity fluctuation between Examples 1 and 2. Both Examples 1 and 2 had smaller chromaticity fluctuation than Comparative Example A.

Although suitable embodiments are described above, the present disclosure is not limited to such embodiments. The content disclosed in the embodiments is only an example, and various changes can be made without departing from the intent of this disclosure. Any modification made to the extent that does not depart from the purpose of the present disclosure naturally belongs to the technical scope of the present disclosure.

What is claimed is:
1. A display device comprising:
   a wiring region including a gate wiring, a source wiring intersecting the gate wiring, and a first insulating layer between the gate wiring and the source wiring;

an opening region including a pixel electrode on the first insulating layer and adjacent to the wiring region; and
a second insulating layer between the source wiring and the pixel electrode,
wherein the first insulating layer includes a first oxide insulating layer and a first nitride insulating layer,
the first oxide insulating layer is disposed over the wiring region and the opening region,
the first nitride insulating layer is disposed in the wiring region and includes a first opening overlapping the opening region,
the pixel electrode overlaps the first opening, and
the second insulating layer includes a second oxide insulating layer and a second nitride insulating layer.

2. The display device according to claim 1,
wherein the second oxide insulating layer is disposed over the wiring region and the opening region, and
the second nitride insulating layer is disposed in the wiring region and includes a second opening overlapping the opening region.

3. The display device according to claim 2, wherein the first opening overlaps the second opening, and
an edge of the second opening is disposed further inside of the first opening in the opening region than an edge of the first opening.

4. The display device according to claim 1,
wherein the second oxide insulating layer and the second nitride insulating layer are disposed over the wiring region and the opening region.

5. A display device comprising:
a wiring region including a gate wiring, a source wiring intersecting the gate wiring, and a first insulating layer between the gate wiring and the source wiring;
an opening region including a pixel electrode on the first insulating layer and adjacent to the wiring region;
a first substrate disposed with the wiring region and the opening region;
a second substrate disposed opposite the first substrate and disposed with a common electrode opposite the pixel electrode;
a liquid crystal layer disposed between the first substrate and the second substrate; and
a light source irradiating light onto a side surface of the first substrate or a side surface of the second substrate,
wherein the first insulating layer includes a first oxide insulating layer and a first nitride insulating layer,
the first oxide insulating layer is disposed over the wiring region and the opening region,
the first nitride insulating layer is disposed in the wiring region and includes a first opening overlapping the opening region, and
the pixel electrode overlaps the first opening.

6. The display device according to claim 5, wherein the liquid crystal layer is a polymer dispersed liquid crystal,
when the polymer dispersed liquid crystal is in a scattering state, scatters light emitted from the light source, and
when the polymer dispersed liquid crystal is in a non-scattering state, a background of the second substrate is visible through the opening region from the first substrate, and a background of the first substrate is visible from the second substrate.

* * * * *